US012776932B2

(12) United States Patent
Choi et al.

(10) Patent No.: US 12,776,932 B2
(45) Date of Patent: Oct. 27, 2026

(54) CLOCK REFERENCE PAM3 TRANSCEIVER FOR SINGLE-ENDED SIGNAL

(71) Applicant: SEOUL NATIONAL UNIVERSITY R&DB FOUNDATION, Seoul (KR)

(72) Inventors: Wooseok Choi, Seoul (KR); Kahyun Kim, Seoul (KR)

(73) Assignee: SEOUL NATIONAL UNIVERSITY R&DB FOUNDATION, Seoul (KR)

(*) Notice: Subject to any disclaimer, the term of this patent is extended or adjusted under 35 U.S.C. 154(b) by 0 days.

(21) Appl. No.: 18/799,233

(22) Filed: Aug. 9, 2024

(65) Prior Publication Data

US 2025/0300863 A1 Sep. 25, 2025

(51) Int. Cl.

| | |
|---|---|
| ***H04L 25/49*** | (2006.01) |
| ***H03K 5/00*** | (2006.01) |
| ***H04B 1/40*** | (2015.01) |
| ***H04L 25/02*** | (2006.01) |

(52) U.S. Cl.

CPC ........... *H04L 25/4917* (2013.01); *H04B 1/40* (2013.01); *H04L 25/0272* (2013.01); *H03K 2005/00013* (2013.01)

(58) Field of Classification Search

CPC .. H03K 7/02; H03K 2005/00013; H04B 1/38; H04B 1/40; H04B 3/50; H04B 14/023; H04L 25/0264; H04L 25/0272; H04L 25/4917

USPC ................ 375/219, 220, 257, 286–288, 353; 370/282, 284; 455/63.1, 70

See application file for complete search history.

(56) References Cited

U.S. PATENT DOCUMENTS

| | | | | |
|---|---|---|---|---|
| 9,344,203 | B2 | 5/2016 | Ran | |
| 9,673,849 | B1 * | 6/2017 | Paraschou | H04B 1/76 |
| 10,686,582 | B1 * | 6/2020 | Pasdast | H03L 1/00 |
| 11,841,815 | B1 * | 12/2023 | Farjadrad | G06F 13/4027 |
| 2006/0233291 | A1 * | 10/2006 | Garlepp | H04L 7/0276 375/355 |
| 2013/0195155 | A1 * | 8/2013 | Pan | H03D 1/00 375/317 |
| 2019/0238168 | A1 * | 8/2019 | Nedovic | H04B 1/10 |
| 2020/0075069 | A1 * | 3/2020 | Kim | G11C 5/04 |
| 2022/0294673 | A1 * | 9/2022 | Choi | H04L 7/02 |
| 2022/0357831 | A1 * | 11/2022 | Kim | G09G 3/2092 |
| 2023/0046477 | A1 | 2/2023 | Mangaser et al. | |

(Continued)

FOREIGN PATENT DOCUMENTS

| | | |
|---|---|---|
| KR | 10-2004-0014822 A | 2/2004 |
| KR | 10-2020-0139844 A | 12/2020 |
| KR | 10-2349415 B1 | 1/2022 |

*Primary Examiner* — Young T. Tse

(74) *Attorney, Agent, or Firm* — Bridgeway IP Law Group, PLLC; Jihun Kim

(57) ABSTRACT

A semiconductor package according to an embodiment of the present disclosure includes a chiplet including a first die and a second die, a transmission chip included in the first die, configured to modulate single-ended data into a PAM3 multi-level signal, and configured to transmit the PAM3 multi-level signal and a plurality of clock signals to the second die, and a reception chip included in the second die and configured to generate single-ended data by differentially comparing the PAM3 multi-level signal with the plurality of clock signals received from the first die. The transmission chip are connected to the reception chip through a plurality of channels.

8 Claims, 5 Drawing Sheets

(56) References Cited

U.S. PATENT DOCUMENTS

| | | | | |
|---|---|---|---|---|
| 2025/0007628 | A1* | 1/2025 | Duan | H04B 17/17 |
| 2025/0053190 | A1* | 2/2025 | Kang | G06F 1/10 |

* cited by examiner

| Compared data | | Decoded data |
|---|---|---|
| sampler 1 | sampler 2 | |
| 0 | 0 | L |
| 0 | 1 | M |
| 1 | 0 | M |
| 1 | 1 | H |

CLOCK REFERENCE PAM3 TRANSCEIVER FOR SINGLE-ENDED SIGNAL

CROSS-REFERENCE TO RELATED APPLICATION

This application is based on and claims priority under 35 U.S.C. § 119 to Korean Patent Application No. 10-2024-0038194, filed on Mar. 20, 2024, in the Korean Intellectual Property Office, the disclosure of which is incorporated by reference herein in its entirety.

BACKGROUND

The present disclosure provides a chipset using a Pulse Amplitude Modulation 3-level (PAM3) signal to remove noise generated when data is transmitted to and received from a circuit that constitutes a system on chip (SOC) of a chiplet.

The Chiplet is technology that manufactures multiple chips from different dies and connects the multiple chips to each other through an internal interface to form one chipset group, unlike the conventional technology that generates a huge chipset on a single die.

The chiplet is more productive than the known method of cutting and manufacturing wafers and may add various functions, and accordingly, system semiconductor companies, such as AMD, are adopting the chiplet to develop and produce wafers.

FIG. 1 is a diagram illustrating a configuration of a chiplet including a plurality of SOCs and describing noise and reference offset generated by the chiplet.

Referring to FIG. 1, the conventional chiplet includes many SOCs in one package, that is, many digital chips are integrated in the chiplet, and accordingly, a supply voltage of an input/output unit (I/O) of the chiplet includes more noise than a supply voltage of the conventional chipset. Also, because integrated digital chips consume instantaneous currents, high-amplitude noise is generated in the supply voltage and a ground node of a local package. This situation causes a high reference offset when signals are transmitted to and received from packages inside and outside the chiplet.

In addition, because the chiplet has to integrate many chips in a small area, a transceiver of the chiplet has to transmit and receive a single-ended signal that is vulnerable to noise and crosstalk at a high speed.

In this case, when a receiver determines data, an error may occur due to a reference offset of the single-ended signal and a noise of a supply voltage, and as a result, a bit error rate (BER) increases. That is, in FIG. 1, a signal transmitted from a first SOC is received as a signal (a received signal over noisy PCB channel) including noise at a second SOC, and accordingly, there is a difference between the transmitted signal and the received signal.

The chiplet is effective in increasing semiconductor yield and reducing costs, but data has to be transmitted quickly and accurately in an interface circuit.

The present technology uses a signaling method suitable for a chipset signal environment, may transmit a single-ended signal at a high speed, and is robust to noise.

SUMMARY

The present disclosure provides a chiplet that may reduce noise and reference offset generated while signals are transmitted and received between SOCs constituting the chiplet by using a PAM3 multi-level signal.

Technical tasks that the present embodiment aims to achieve are not limited to the technical tasks described above, and other technical tasks may exist.

According to an aspect of the present disclosure, a semiconductor package includes a chiplet including a first die and a second die, a transmission chip included in the first die, configured to modulate single-ended data into a PAM3 multi-level signal, and configured to transmit the PAM3 multi-level signal and a plurality of clock signals to the second die, and a reception chip included in the second die and configured to generate single-ended data by differentially comparing the PAM3 multi-level signal with the plurality of clock signals received from the first die, wherein the transmission chip are connected to the reception chip through a plurality of channels.

Also, the transmission chip may include a data transmitter configured to modulate the PAM3 multi-level signal, and a plurality of clock transmitters configured to respectively transmit the plurality of clock signals.

Also, the data transmitter may receive two pieces of single-ended data and generate the PAM3 multi-level signal of which amplitude is modulated into three multi-levels, and the three multi-levels may include three voltage levels, each having a preset reference value.

Also, the plurality of clock transmitters may transmit differential clock signals respectively through different channels connected to each other, and the plurality of clock transmitters may respectively transmit the plurality of clock signals modulated to have different multi-level amplitudes.

Also, each of the plurality of clock transmitters may include a capacitive equalizer configured to offset attenuations of the plurality of channels and a preset driver configured to modulate an amplitude of the clock signal.

Also, the reception chip may include a clock receiver configured to receive the plurality of clock signals from the plurality of clock transmitters, a data receiver including a plurality of samplers configured to respectively receive the PAM3 multi-level signal and the plurality of clock signals respectively from the data transmitter and the clock receiver and configured to differentially compare the PAM3 multi-level signal with the plurality of clock signals, and a data decoding circuit configured to decode signals differentially compared by the plurality of samplers.

Also, the semiconductor package may further include a delay circuit provided between the clock receiver and the data receiver, wherein the delay circuit may adjust timing for comparing signals of the plurality of samplers with each other according to a preset method.

Also, while the plurality of samplers compare the PAM3 multi-level signal with the plurality of clock signals, the data decoding circuit may perform decoding by calculating height differences between an amplitude of the PAM3 multi-level signal and amplitudes of the plurality of clock signal as data.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
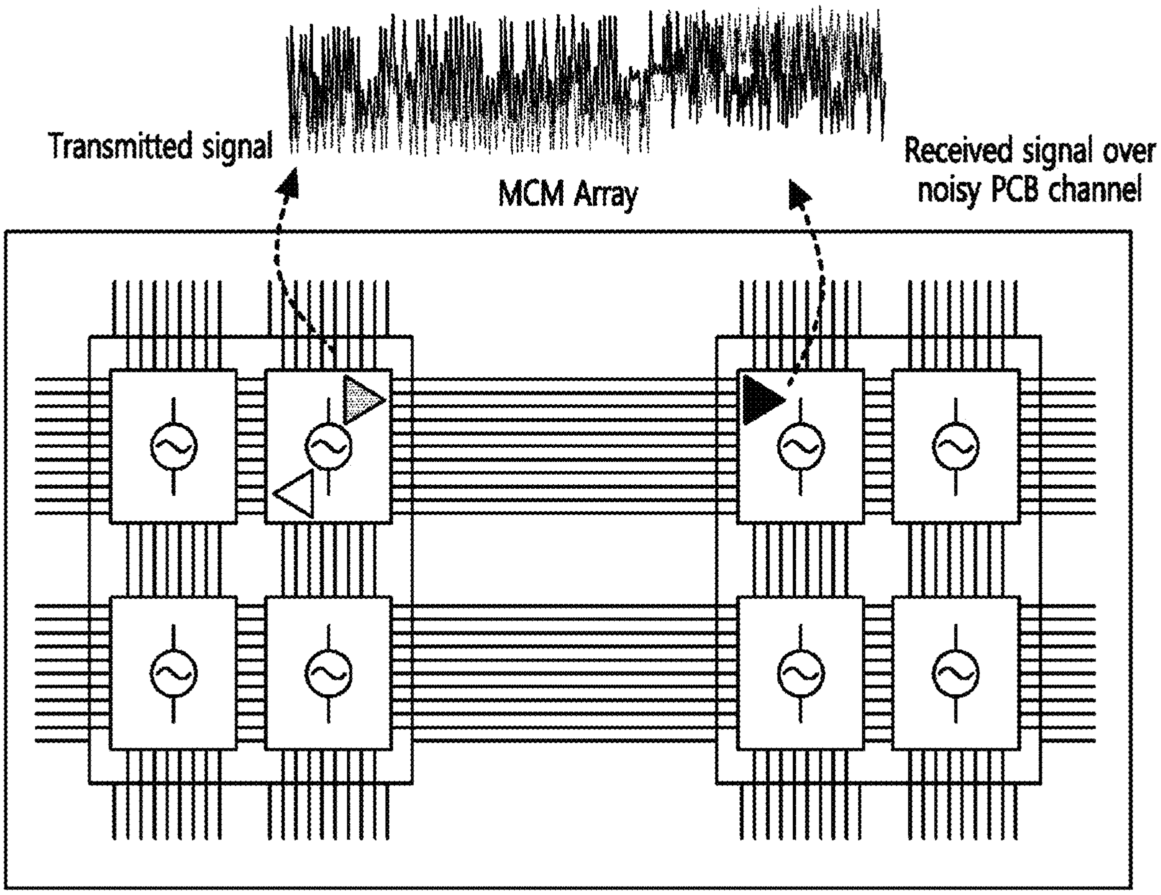
FIG. 1 Prior Art
FIG. 1 is a diagram illustrating a configuration of a chiplet including a plurality of system on chips (SOC)s and noise and reference offset generated by the chiplet.

Hereinafter, embodiments of the present disclosure will be described in detail such that those skilled in the art to which the present disclosure belongs may easily implement the present disclosure with reference to the accompanying drawings. However, the present disclosure may be implemented in many different forms and is not limited to the embodiments to be described herein. In addition, in order to clearly describe the present disclosure with reference to the drawings, portions irrelevant to the description are omitted, and similar reference numerals are attached to similar portions throughout the specification.

When it is described that a portion is "connected" to another portion throughout the specification, this includes not only a case where the portion is "directly connected" to another portion but also a case where the portion is "indirectly connected" to another portion with another component therebetween. In addition, when it is described that a portion "includes" a certain component, this means that the portion may further include another component without excluding another component unless otherwise stated.

Following embodiments are detailed descriptions to aid understanding of the present disclosure and do not limit the scope of the present disclosure. Accordingly, inventions of the same scope and performing the same function as the present disclosure are also included in the scope of rights of the present disclosure.

Figure 2:
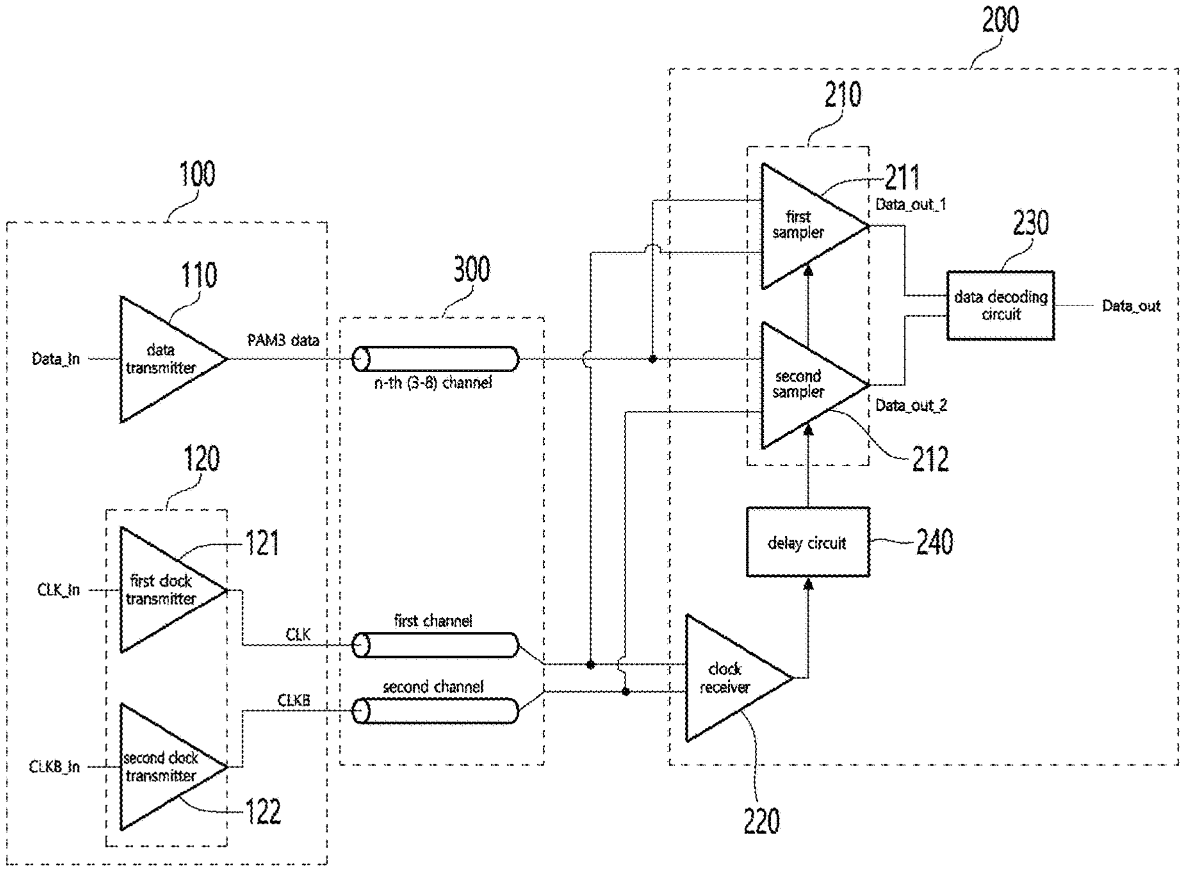
FIG. 2 is a block diagram illustrating a transceiver having a function of transmitting and receiving a PAM3 multi-level signal, according to an embodiment of the present disclosure.

FIG. 2 is a block diagram illustrating a transceiver having a function of transmitting and receiving a PAM3 multi-level signal, according to an embodiment of the present disclosure.

Referring to FIG. 2, a chiplet including a transceiver may include a transmission chip 100 and a reception chip 200 which are included in one die (hereinafter, technology is described based on a "first die" and a "second die" included in one chiplet, and the first die and the second die may each include the transmission chip 100 and the reception chip 200), the one die may be included in the chiplet, and the transmission chip 100 may be connected to the reception chip 200 through a plurality of channels 300.

According to an embodiment of the present disclosure, the transceiver having a function of transmitting and receiving PAM3 multi-level signals may remove noise generated when data is transmitted and received to and from a plurality of dies included in the chiplet.

Specifically, the transmission chip 100 may be included in the first die, modulate single-ended data into a PAM3 multi-level signal, and transmit the generated PAM3 multi-level signal and a plurality of clock signals to the second die.

In this case, the transmission chip 100 may include a data transmitter 110 that modulates a PAM3 multi-level signal, and a plurality of clock transmitters 120 which transmit a plurality of clock signals.

Also, the data transmitter 110 may receive two pieces of single-ended data and generate a PAM3 multi-level signal of which amplitude is modulated into three multi-levels.

In this case, the single-ended data corresponds to a type of input data with a value of 0 or 1, and the three multi-levels are composed of three voltage levels, each having a preset reference value. For example, based on a specific voltage value, the three multi-levels may be composed of a high level H, a middle level M, and a low level L.

Also, the plurality of clock transmitters 120 may transmit differential clock signals through different channels among the plurality of channels 300, for example, a first channel and a second channel, connected to each other. In this case, the plurality of clock transmitters 120 may transmit clock signals modulated with different multi-level amplitudes.

Figure 4:
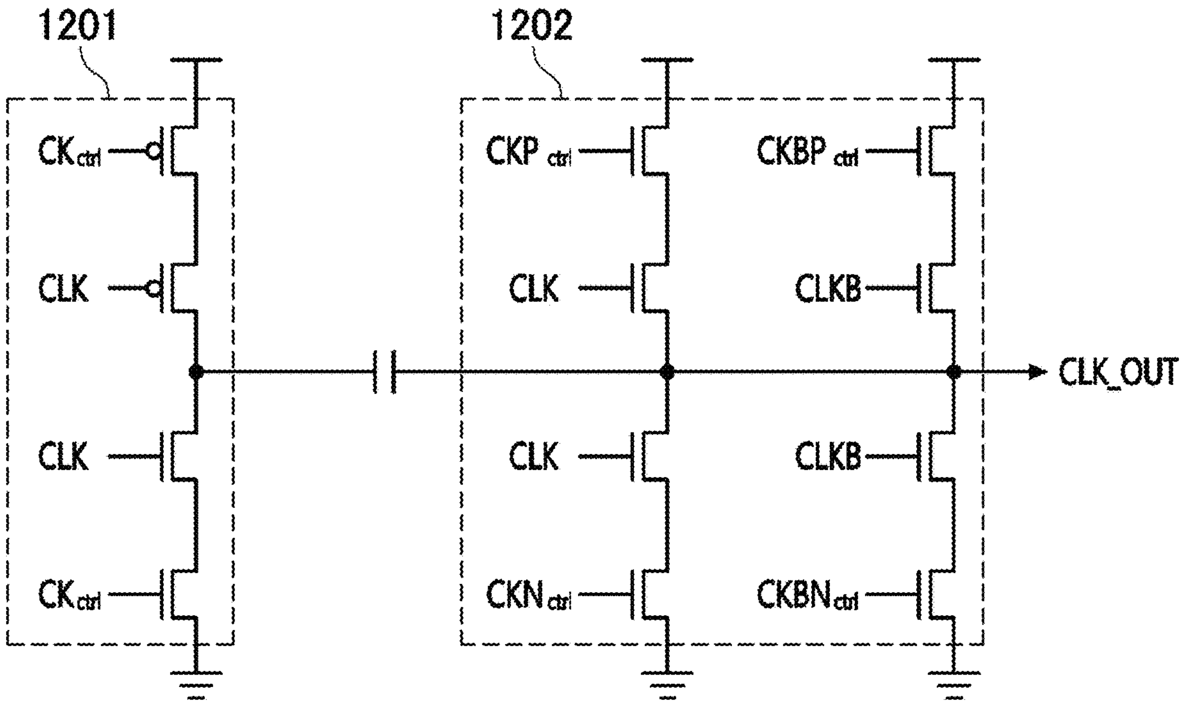
FIG. 4 is a circuit diagram illustrating a clock transmitter according to an embodiment of the present disclosure.

Also, referring to FIG. 4, the plurality of clock transmitters 120 may each include a capacitive equalizer 1201 that offsets attenuations of the plurality of channels 300 and a preset driver 1202 for modulating an amplitude of a clock signal.

When the clock signal is at a high level, the capacitive equalizer 1201 of each of the plurality of clock transmitters 120 may perform an equalization operation of amplifying a voltage increase of an output node. In this case, the amount of equalization may be adjusted by a value CKctrl which may be adjusted digitally.

A main driver 1202 of each of the plurality of clock transmitters 120 may determine a voltage level of the output node when a clock signal is at a high level, based on a ratio between a value CKPctrl and a value CKNctrl which may be digitally adjusted.

When the clock signal is at a low level, the capacitive equalizer 1201 of each of the plurality of clock transmitters 120 may perform an equalization operation of amplifying a voltage drop of the output node. In this case, the amount of equalization may be adjusted by the value CKctrl which may be digitally adjusted.

Also, the main driver 1202 of each of the plurality of clock transmitters 120 may determine a voltage level of the output node when the clock signal is at a low level, based on the ratio between the value CKBPctrl and the value CKBNctrl which may be digitally adjusted.

In addition, FIG. 2 illustrates a pair of a first clock transmitter 121 and a second clock transmitter 122 which respectively transmit signals of different amplitudes to the first and second channels among the plurality of channels 300, and configurations and operation methods of the first clock transmitter 121 and the second clock transmitter 122 are the same as each other.

According to an embodiment of the present disclosure, the reception chip 200 may be included in the second die and generate single-ended data by differentially comparing a PAM3 multilevel signal with a clock signal received from the first die.

In this case, the reception chip 200 may include a data receiver 210, a clock receiver 220, and a data decoding circuit 230.

First, the data receiver 210 may receive a PAM3 multi-level signal and a plurality of clock signals respectively from the data transmitter 110 and the clock receiver 220, and may be a circuit including a first sampler 211 and a second sampler 212 that differentially compare the received PAM3 multi-level signal with a plurality of clock signals.

In addition, the clock receiver 220 may receive a plurality of clock signals from the plurality of clock transmitters 120, and the data decoding circuit 230 may generate single-ended data by decoding the differentially compared signals through the first sampler 211 and the second sampler 212.

Also, the reception chip 200 may further include a delay circuit 240 between the clock receiver 220 and the data receiver 210. In this case, the delay circuit 240 may adjust the timing for comparing signals of the first sampler 211 and the second sampler 212 according to a preset method.

Also, while comparing the PAM3 multi-level signal with the plurality of clock signals through the first sampler 211 and the second sampler 212, the data decoding circuit 230 may perform decoding by calculating a height difference between an amplitude of the PAM3 multi-level signal with an amplitude of the clock signal as data.

Figure 3:
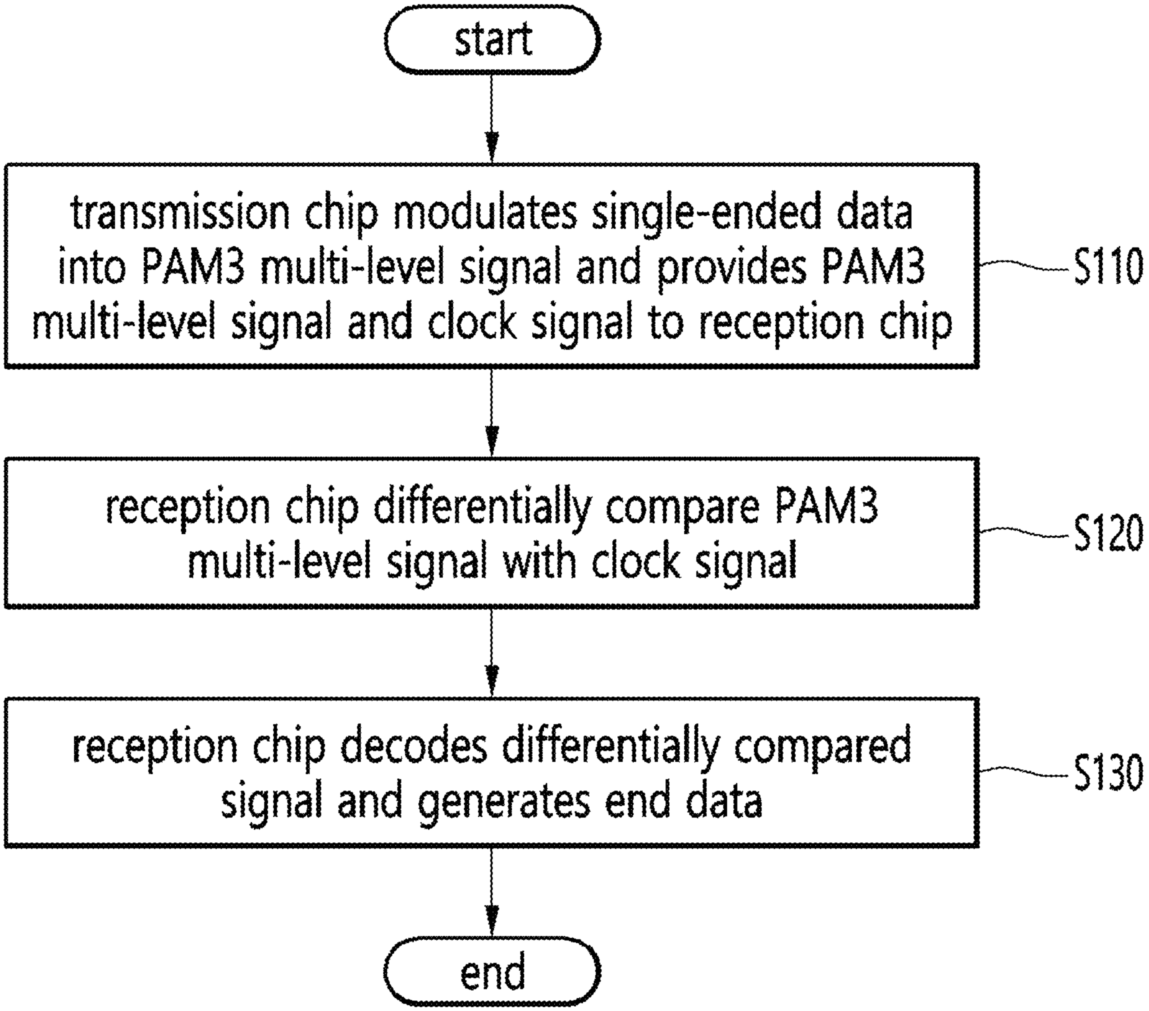
FIG. 3 is an operation flowchart illustrating a process of transmitting and receiving signals without noise through a PAM3 multi-level signal, according to an embodiment of the present disclosure.

FIG. 3 is an operation flowchart illustrating a process of transmitting and receiving signals without noise through the PAM3 multi-level signal, according to an embodiment of the present disclosure.

Referring to FIG. 3, the transmission chip 100 modulates single-ended data into a PAM3 multi-level signal and provides the PAM3 multi-level signal and a clock signal to the reception chip 200 (S110).

Figure 5:
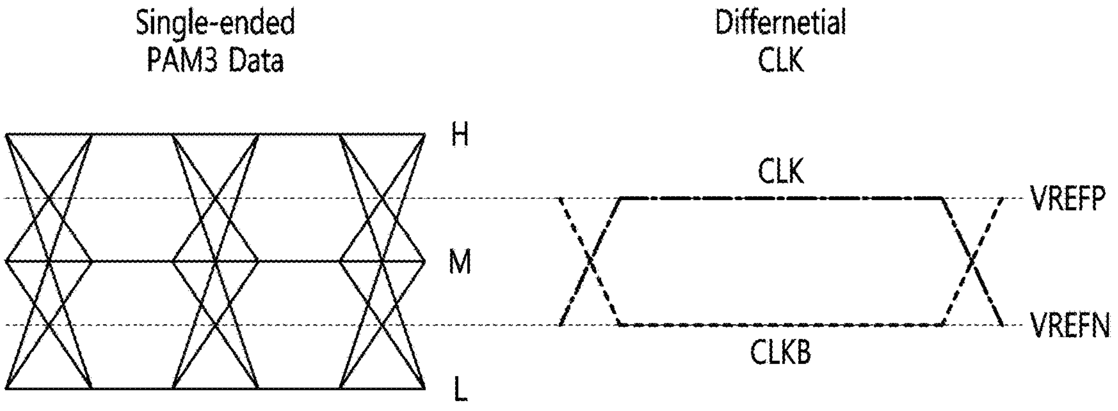
FIG. 5 is a diagram illustrating an operation of generating amplitude-modulated clocks by using a clock transmitter, according to an embodiment of the present disclosure.

In this case, referring to FIG. 5, unlike the conventional clock that toggles between a supply voltage VDD and a ground node GND, the clock according to the embodiment of the present disclosure toggles at voltage levels of a first reference voltage VREFP and a second reference voltage VREFN.

In this case, the first reference voltage VREFP has an intermediate value between the high level H and the middle level M of data and is used to distinguish between the high level H and the middle level M of PAM3 data. Also, the second reference voltage VREFN has an intermediate value between the middle level M level and the low level L of data and is used to distinguish between the middle level M and the low level L of the PAM3 data.

Because clock signals passing through the first and second channels among the plurality of channels 300 are different from each other, when one signal represents the first reference voltage VREFP, the other signal represents the second reference voltage VREFN.

Also, the clock receiver 220 receives clock signals from the first and second channels among the plurality of channels 300. The delay circuit 240, which is referred to as a digitally controlled delay circuit (DCDL), adjusts the timing of comparing data by the first sampler 211 and the second sampler 212.

Next, the reception chip 200 differentially compares the received PAM3 multi-level signal with a clock signal (S120).

In this case, unlike the conventional data receiver that compares the received data with a reference voltage generated by the reception chip 200, the data receiver 210 according to the present disclosure differentially compares the data signal with the clock signal. Specifically, the first sampler 211 differentially compares the signals received through the first channel and n-th (third to eighth) channels among the plurality of channels 300, and the second sampler 212 differentially compares the signals received through the second channel and the n-th (third to eighth) channels among the plurality of channels 300.

Finally, the reception chip 200 decodes the differentially compared signals and generates terminal data (S130).

In this case, each of the differentiated clock signals may have one of the first reference voltage and the second reference voltage, and accordingly, output values of the first sampler 211 and the second sampler 212 may each be decoded into a value of one of the high level H, the middle level M, and the low level L.

Figures 6, 7:
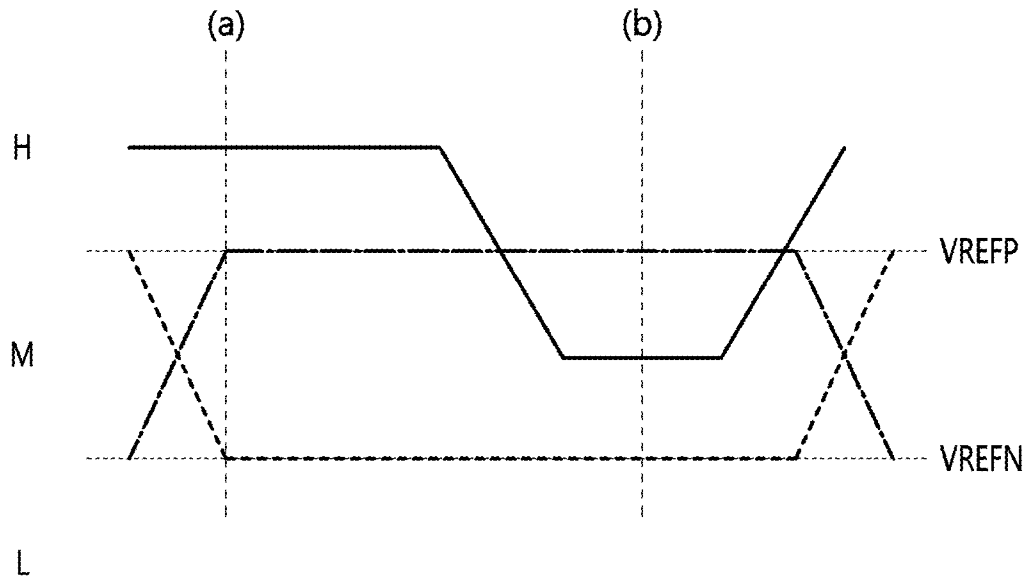
FIGS. 6 and 7 are diagrams illustrating an operation of decoding data by using a decoding circuit, according to an embodiment of the present disclosure.

For example, as shown in a table of FIG. 6, when output values of the first sampler 211 and the second sampler 212 are (1, 1), data has a higher value than the first reference voltage VREFP and the second reference voltage VREFN, and accordingly, the data decoding circuit 230 may decode the corresponding data into a value of the high level H.

Next, when the output values of the first sampler 211 and the second sampler 212 are (0, 1) or (1, 0), the data is lower than the first reference voltage VREFP and the second reference voltage VREFN, and accordingly, the data decoding circuit 230 may decode the corresponding data into a value of the middle level M.

Finally, when the output values of the first sampler 211 and the second sampler 212 are (0, 0), the data is lower than the first reference voltage VREFP and the second reference voltage VREFN, and accordingly, the data decoding circuit 230 may decode the corresponding data into a value of the low level L.

Referring to an image of FIG. 7, the data decoding circuit 230 may decode data into a value of the high level H because an output value of a certain sampler at a point (a) is higher than the first reference voltage VREFP and the second reference voltage VREFN.

Also, the data decoding circuit 230 uses a method of decoding the data into a value of the middle level M because the output value of the certain sampler at a point (b) is lower than the first reference voltage VREFP and is higher than the second reference voltage VREFN.

In addition, there are noises in the supply voltage VDD and the ground node GND of the transmission chip 100 and the reception chip 200. Accordingly, a reference offset occurs through a difference in voltage level due to a noise difference between the transmission chip 100 and the reception chip 200.

However, by applying the technology of the present disclosure, data of the three voltage levels H, M, and L and clock signals of the first and second reference voltages VREFP and VREFN include only the noise of the transmission chip 100 in the same manner as each other, and accordingly, the data and clock signals are not affected by a reference offset.

Also, noises of the transmission chip 100 and the reception chip 200 may be removed through differential comparison in the reception chip 200. Accordingly, the reception chip 200 does not require a separate circuit for compensating for the reference offset and supply voltage noise, and solves the problem of noise and reference offset together.

According to the present disclosure, it is possible to implement a chiplet that may reduce noise and reference offset, which are generated while signals are transmitted and received between SOCs constituting the chiplet, by using a PAM3 multi-level signal.

Specifically, a transceiver included in the chiplet transmits a multi-level clock signal with the same voltage level as a plurality of reference voltages through a reference voltage for distinguishing the multi-level clock signal, and differentially compares a data signal with the multi-level clock signal to remove the noise included in the signals.

Also, the technology of the present disclosure uses multiple levels of clocks as reference voltages without using a separate channel for transmitting the reference voltages or without using a digital-to-analog conversion circuit in a receiving device, and thus, an area of a transceiver may be reduced, and the degree of integration of a circuit may be increased.

An embodiment of the present disclosure may be implemented in the form of a recording medium including instructions executable by a computer, such as a program module executed by a computer. A computer readable medium may be any available medium that may be accessed by a computer and includes both volatile and nonvolatile media, removable and non-removable media. Also, the computer readable medium may include a computer storage medium. A computer storage medium includes both volatile and nonvolatile media and removable and non-removable media implemented by any method or technology for storing information, such as computer readable instructions, data structures, program modules or other data.

Although the method and system of the present disclosure are described with respect to specific embodiments, some or all of components or operations thereof may be implemented by using a computer system having a general-purpose hardware architecture.

The above descriptions of the present disclosure are for illustrative purposes only, and those skilled in the art to which the present disclosure belongs will understand that the present disclosure may be easily modified into another specific form without changing the technical idea or essential features of the present disclosure. Therefore, the embodiments described above should be understood as illustrative in all respects and not limiting. For example, each component described as a single type may be implemented in a distributed manner, and similarly, components described in a distributed manner may also be implemented in a combined form.

What is claimed is:

1. A semiconductor, comprising:

a chiplet including a first die and a second die;

a transmission chip included in the first die, configured to modulate single-ended data into a Pulse Amplitude Modulation 3-level (PAM3) signal, and configured to transmit the PAM3 signal and a plurality of clock signals to the second die; and a reception chip included in the second die, configured to generate the single-ended data by differentially comparing the PAM3 signal with the plurality of clock signals received from the first die, wherein the transmission chip is connected to the reception chip through a plurality of channels.

2. The semiconductor of claim 1, wherein the transmission chip includes:

a data transmitter configured to modulate the PAM3 signal; and a plurality of clock transmitters configured to respectively transmit the plurality of clock signals.

3. The semiconductor of claim 2, wherein the data transmitter receives two pieces of the single-ended data and generates the PAM3 signal of which amplitude is modulated into three multi-levels, and the three multi-levels include three voltage levels, each having a preset reference value.

4. The semiconductor of claim 2, wherein a first clock transmitter and a second clock transmitter of the plurality of clock transmitters transmit differential clock signals respectively through a first clock channel and a second clock channel of the plurality of channels, and wherein the first and second clock transmitters respectively transmit the differential clock signals modulated with different multi-level amplitudes.

5. The semiconductor of claim 4, wherein each of the first and second clock transmitters includes a capacitive equalizer configured to offset attenuations of the first and second channels and a preset driver configured to modulate an amplitude of each of the plurality of clock signals.

6. The semiconductor of claim 2, wherein the reception chip includes:

a clock receiver configured to receive the plurality of clock signals from the plurality of clock transmitters;

a data receiver coupled to the clock receiver, wherein the data receiver includes a first sampler and a second sampler, each having a first input coupled to the data transmitter through a data channel of the plurality of channels, and a second input respectively connected to a first clock transmitter and a second clock transmitter of the plurality of clock transmitters through a first clock channel and a second clock channel of the plurality of channels to differentially compare the PAM3 signal with the plurality of clock signals; and a data decoding circuit coupled to the first and second samplers and configured to decode the differentially compared signals therein to obtain the regenerated single-ended data.

7. The semiconductor of claim 6, wherein the reception chip further includes:

a delay circuit coupled between the clock receiver and the data receiver, wherein the delay circuit adjusts timing for the differentially compared signals of the first and second samplers according to a preset method.

8. The semiconductor of claim 6, wherein when comparing the PAM3 signal with the plurality of clock signals through the first and second samplers, the data decoding circuit performs data decoding by calculating height differences between an amplitude of the PAM3 signal and amplitudes of the plurality of clock signals.

* * * * *